(12) United States Patent
Peng (10) Patent No.: US 7,910,925 B2
(45) Date of Patent: Mar. 22, 2011

(54) ARRAY SUBSTRATE AND METHOD OF MANUFACTURING THE SAME

(75) Inventor: Zhilong Peng, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/128,745

(22) Filed: May 29, 2008

(65) Prior Publication Data

US 2009/0108261 A1    Apr. 30, 2009

(30) Foreign Application Priority Data

Oct. 29, 2007    (CN) .......................... 2007 1 0176466

(51) Int. Cl.
*H01L 29/04* (2006.01)
(52) U.S. Cl. .................... 257/59; 257/72; 257/E21.414; 349/48; 349/49; 349/50; 345/90; 345/91; 345/92
(58) Field of Classification Search .................... 257/59, 257/E21.414, E29.003, 72; 438/158; 345/90–92; 349/48–50
See application file for complete search history.

(56) References Cited

U.S. PATENT DOCUMENTS 5,528,395 A * 6/1996 So .................................. 349/42
6,392,254 B1 * 5/2002 Liu et al. ......................... 257/59
2001/0054711 A1 * 12/2001 Numao ............................ 257/72
2004/0119901 A1    6/2004 Kang
2004/0257513 A1 * 12/2004 Chin et al. ..................... 349/142

FOREIGN PATENT DOCUMENTS

| JP | 62135814 A * | 6/1987 |
| JP | 2003-188384 | 7/2003 |
| JP | 2003-195260 | 7/2003 |
| KR | 1995-29822 | 11/1995 |

OTHER PUBLICATIONS

English abstract of KR 1995-29822 dated Nov. 24, 1995.
Patent Abstracts of Japan and English translation of JP 2003-195260 dated Jul. 9, 2003.
Patent Abstracts of Japan and English translation of JP 2003-188384 dated Jul. 4, 2003.

* cited by examiner

*Primary Examiner* — Lynne A Gurley
*Assistant Examiner* — Naima J Kearney
(74) *Attorney, Agent, or Firm* — Ladas & Parry LLP (57) ABSTRACT

The present invention provides an array substrate and a method for manufacturing the same. The array substrate comprises a substrate and a plurality of gate lines parallel to each other and a plurality of data lines parallel to each other formed on the substrate, the gate lines intersecting the data lines to define a plurality of pixel region arranged in a matrix, each pixel region comprising a thin film transistor, a pixel electrode and a thin film diode. With respect to each pixel region in a row, the pixel electrode is connected with the gate line in the present row through the thin film transistor and is connected with the gate line in a previous row through the thin film diode.

8 Claims, 4 Drawing Sheets

ARRAY SUBSTRATE AND METHOD OF MANUFACTURING THE SAME

BACKGROUND OF THE INVENTION

The present invention relates to an array substrate of a thin film transistor liquid crystal display (TFT-LCD) and a method of manufacturing the same.

Image-sticking is one of the problems to be solved in connection with image quality of a thin film transistor liquid crystal display (TFT-LCD). A TFT-LCD displays a frame of image in a retention mode. If a same image is displayed for a long time, the liquid crystal molecules of being driven may be polarized, such that the orientation of the liquid crystal molecules cannot be controlled with a signal voltage any more. In this case, even when the screen is switched to a next image, the last image is still weakly displayed on screen. This phenomenon is called as "image-sticking." For example, when a typical checker pattern is displayed for a long time and the screen is switched to another image, for example, grey-scale image, it is found that the checker pattern is still displayed partially on screen. This is the image-sticking problem.

Current research shows that image-sticking is related to materials of an alignment layer. The image displayed for a long time as described above causes charge accumulation on alignment layers or other energy-storing microstructure on both sides of the liquid crystal layer, generating an additional voltage difference between pixel electrodes, i.e., a certain DC bias voltage. Thus, when a data signal of a different image is applied, the liquid crystal molecules are aligned similarly and generate partially a same optical rotation effect as that in the previous image. Current solution to solve the problem of image-sticking is material diversification and process development.

Figure 6:
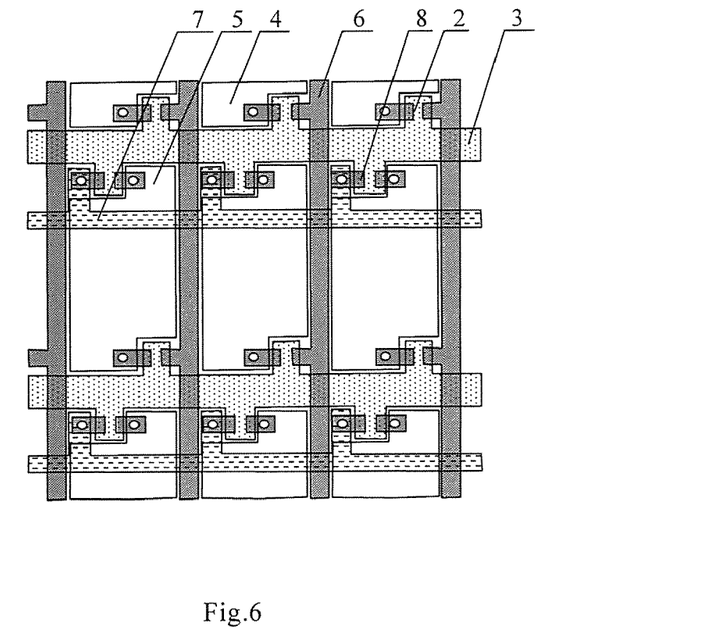
FIG. 6 is a schematic view showing a conventional array substrate.
Figure 7:
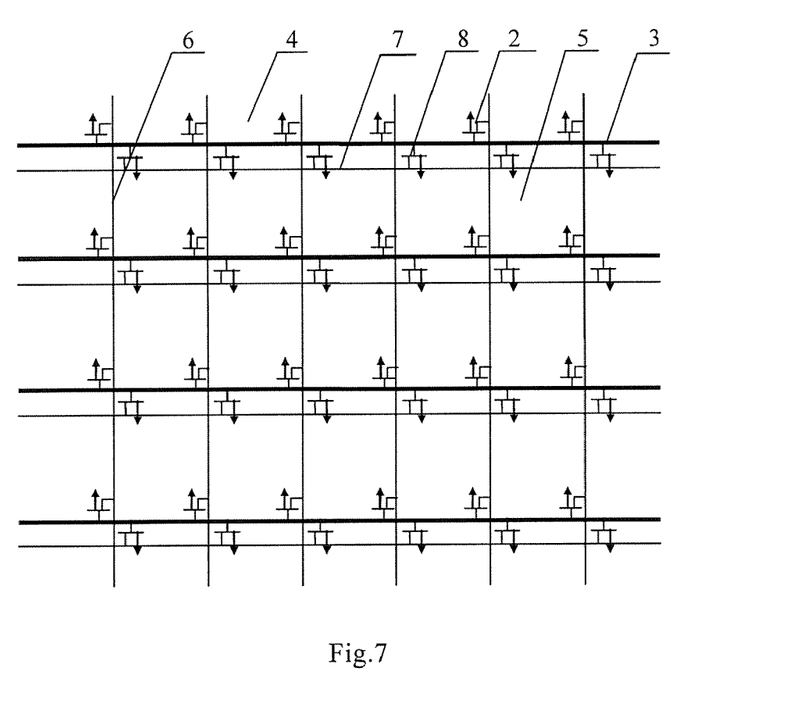
FIG. 7 is a schematic view showing an equivalent circuit of the conventional array substrate.

FIG. 6 is a schematic view showing a conventional TFT-LCD array substrate. FIG. 7 is a schematic view showing an equivalent circuit of the conventional array substrate. The conventional pixel structure comprises a first thin film transistor 2, a gate line 3, a pixel electrode 4, a pixel electrode 5 in a next row, a data line 6, a common electrode 7, and a second thin film transistor 8. On the array substrate, a plurality of gate lines parallel to each other intersect a plurality of data lines parallel to each other to define a plurality of pixel region arranged in a matrix. The first thin film transistor 2 is disposed between the gate line 3 and the pixel electrode 4 in a corresponding row to control charging and discharging of the pixel electrode 4 and display images. The second thin film transistor 8 is provided between the gate line 3 and the pixel electrode 5 in the next row. A source electrode of the second thin film transistor 8 is connected with the common electrode 7 in the next row, and a drain electrode of the second thin film transistor 8 is connected with the pixel electrode 5. In operation, when a scan signal for the present row is applied, the signal on the gate line 3 controls the common electrode 7 to be connected with the pixel electrode 5 in the next row such that charges accumulated on the pixel electrode 5 in the next row is discharged; when a scan signal for the next row is applied, there is no charge accumulated on the pixel electrode 5 in the next row, thereby reducing the image-sticking phenomenon.

However, in this conventional technology, as shown in FIG. 6, the second thin film transistor 8 occupies a portion of the pixel electrode 5 in the next row, decreasing the aperture ratio and deteriorating image quality of the TFT-LCD, such as brightness and contrast ratio.

SUMMARY OF THE INVENTION

An exemplar embodiment of the invention provides an array substrate comprising: a substrate; and a plurality of gate lines parallel to each other and a plurality of data lines parallel to each other formed on the substrate, the plurality of gate lines intersecting the plurality of data lines to define a plurality of pixel regions, each pixel region comprising a thin film transistor, a pixel electrode, and a thin film diode, wherein with respect to each pixel region in a row, the pixel electrode is connected with the gate line of the present row through the thin film transistor and connected with the gate line of a previous row through the thin film diode.

Another exemplar embodiment of the invention further provides a method for manufacturing the array substrate, the method comprising:

step 1, depositing a metal film on a substrate, and patterning the metal film to form a plurality of gate lines parallel to each other and a first and second gate electrodes connected with each of the gate lines;

step 2, depositing a gate insulating layer on the substrate after step 1, and patterning the gate insulating layer to form a via hole therein over the first gate electrode;

step 3, sequentially depositing an amorphous silicon film and an n$^+$ amorphous silicon film on the substrate after step 2, and patterning them to form a first amorphous silicon layer and a first n$^+$ amorphous silicon layer over the first gate electrode such that the first amorphous silicon layer is connected with the first gate electrode through the via hole in the gate insulating layer, and to form a second amorphous silicon layer and a second n$^+$ amorphous silicon layer over the second gate electrode;

step 4, depositing a metal film on the substrate after step 3, and patterning the metal film to form a plurality of data lines parallel to each other, a metal electrode layer and a source/drain electrode layer, a source electrode in the source/drain electrode layer being connected with the data line, wherein the metal electrode layer is positioned over the first gate electrode, and the source/drain electrode layer, which comprises the source electrode and a drain electrode, is positioned over the second gate electrode, and removing a portion of the second n$^+$ amorphous silicon layer exposed by the source/drain electrode layer to form a channel region, the plurality of gate lines intersecting the plurality of data lines to define a plurality of pixel regions arranged in a matrix;

step 5, depositing a passivation layer on the substrate after step 4, and patterning the passivation layer to form therein a first via hole over the metal electrode layer and a second via hole over the drain electrode of the source/drain electrode layer; and step 6, depositing a pixel electrode layer on the substrate resulting form step 5, and patterning the pixel electrode layer to form pixel electrodes, wherein with respect to each pixel region in a row, the pixel electrode is connected with the drain electrode in the source/drain electrode layer through the second via hole in the passivation layer so as to be connected with the gate line in the present row, and is connected with the metal electrode layer through the first via hole in the passivation so as to be connected with the gate line in a previous row.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Exemplary embodiments of the present invention will be described hereinafter with reference to the accompanying drawings. The invention may, however, be embodied in many different forms and should not be construed as being limited to the embodiments set forth herein. It should be understood that in this description when a layer or a element is referred to as being "on" or "connected with" another layer or element, this layer or element can be directly on or directly connected with the other layer or element, or an intervening layer may also be present. For simplicity, elements similar to those in the related art are indicated by the similar numerals.

Figure 1:
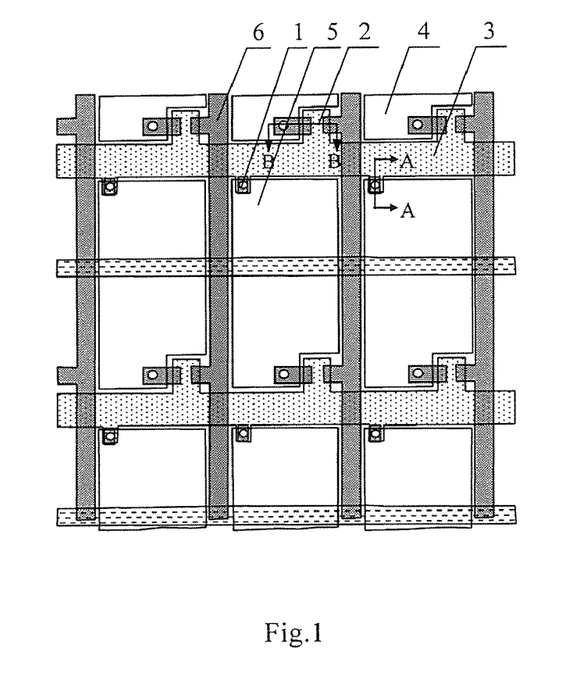
FIG. 1 is a schematic view showing an array substrate according to an exemplar embodiment of the present invention.
Figure 2:
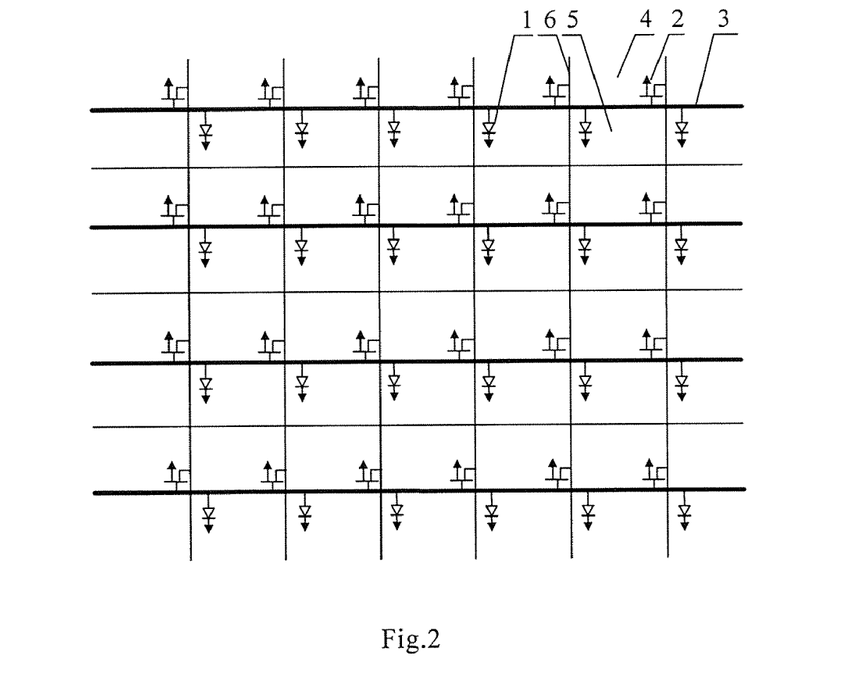
FIG. 2 is a schematic view showing an equivalent circuit of the array substrate according to the exemplar embodiment of the present invention.

FIG. 1 is a schematic view showing an array substrate according to an exemplar embodiment of the present invention; FIG. 2 is a schematic view showing an equivalent circuit of the array substrate according to the embodiment of the present invention.

The array substrate comprises a thin film diode 1, a thin film transistor 2, a gate line 3, a pixel electrode 4 in a present row, a pixel electrode 5 in a next row, and a data line 6. On the array substrate, a plurality of gate lines parallel to each other intersect a plurality of data lines parallel to each other to define a plurality of pixel regions arranged in a matrix. The thin film transistor 2 is provided between the gate line 3 and the pixel electrode 4 in the row corresponding to the gate line 3 to control charging and discharging of the pixel electrode 4 so as to display images. The data line 6 is connected with a source electrode of thin film transistor 2, and the pixel electrode 4 in the present row is connected with a drain electrode of the thin film transistor 2. The thin film diode 1 is provided between the gate line 3 and the pixel electrode 5 in the next row, and the gate line 3 is connected with the pixel electrode 5 in the next row through the thin film diode 1. The embodiment utilizes the thin film diode's characteristic of conduction in a forward direction and cutting-off in a reverse direction. When a scan signal is applied to pixel region in the present row, a high potential over the gate line 3 turn on the thin film diode 1 and is applied to the pixel electrode 5 in the next row to eliminate signal of a last frame remaining on the pixel electrode 5, thereby preventing generation of the DC bias voltage between pixel electrodes due to charge accumulation during a long time display of a same image and effectively reducing image-sticking phenomenon. Alternatively, in view of each pixel region in a row, the pixel electrode is connected with the gate line in the present row through the thin film transistor of the pixel region and connected with the gate line in the previous row through the thin film diode of the pixel region.

Figure 3:
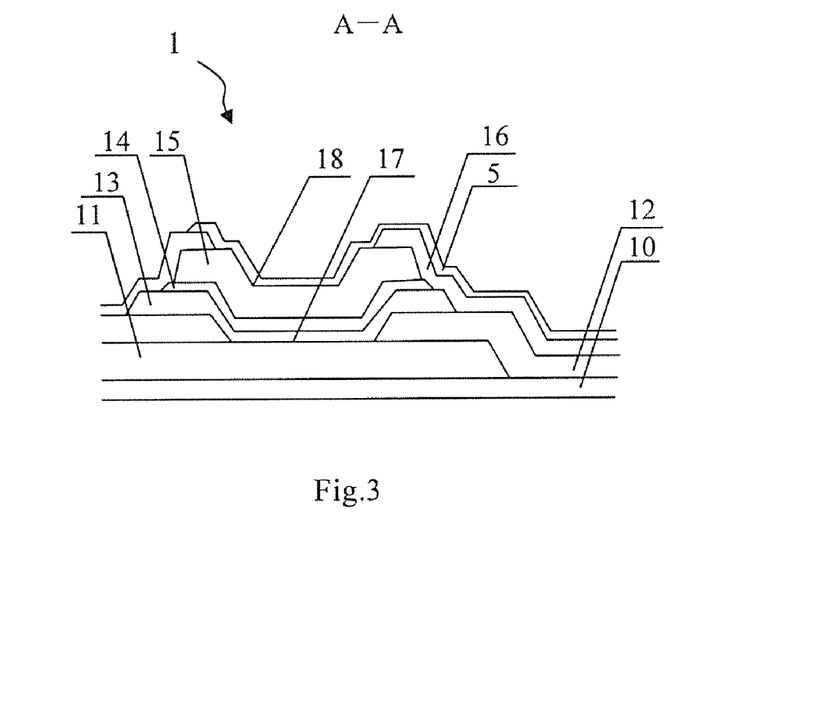
FIG. 3 is a sectional view taken along line A-A in FIG. 1.

FIG. 3 is a sectional view taken along line A-A in FIG. 1 for further illustrating the array substrate of the present invention. As shown in FIG. 3, the thin film diode 1 comprises a first gate electrode 11, a gate insulating layer 12, a first amorphous silicon layer 13, a first n$^+$ amorphous silicon layer 14, a metal electrode layer 15, and a passivation layer 16, that are formed sequentially on a substrate 10. The first gate electrode 11 is connected with the gate line 3, and the first gate electrode 11 is an on-off element of the thin film diode 1. A via hole 17 is disposed in the gate insulating layer 12 corresponding to the first gate electrode 11. The first amorphous silicon layer 13 is connected with the first gate electrode 11 through the via hole 17. The metal electrode layer 15 is disposed above the first gate electrode 11. A first via hole 18 is disposed in the passivation layer 16. The pixel electrode 5 in the next row is connected with the metal electrode layer 15 through the first via hole 18.

Figure 4:
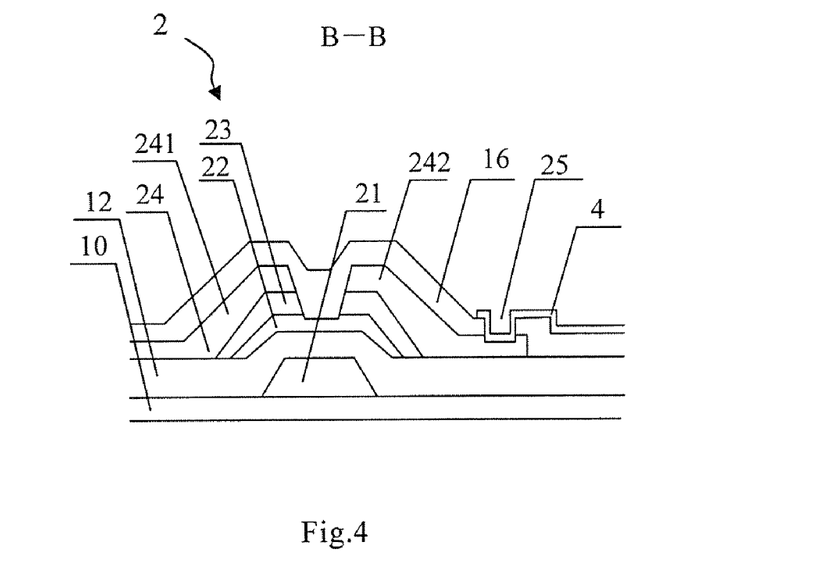
FIG. 4 is a sectional view taken along line B-B in FIG. 1.

FIG. 4 is a sectional view taken along line B-B in FIG. 1. As shown in FIG. 4, the thin film transistor 2 comprises a second gate electrode 21, the gate insulating layer 12, a second amorphous silicon layer 22, a second n$^+$ amorphous silicon layer 23, a source/drain electrode layer 24, and the passivation layer 16, that are formed sequentially on the substrate 10. The second gate electrode 21 is connected with the gate line 3 and acts as an on-off element of the thin film transistor 2. The second amorphous silicon layer 22 is disposed above the second gate electrode 21 and acts as a channel region. The source/drain electrode layer 24 is disposed over the second gate electrode 21 and comprises a source electrode 241 connected with the data line 6 and a drain electrode 242. A second via hole 25 is formed in the passivation layer 16. The pixel electrode 4 in the present row is connected with the drain electrode 242 in the source/drain electrode layer 24 through the second via hole 25.

The array substrate according to the embodiment of the invention includes the thin film diode 1 disposed between the pixel electrode 5 in the next row and the gate line 3. The thin film diode 1 comprises the first gate electrode 11, the first amorphous silicon layer 13, the first n$^+$ amorphous silicon layer 14 and the metal electrode layer 15. Using the thin film diode's characteristic of conduction in a forward direction and cutting off in a reverse direction, when a scan signal is applied over the signal line 3 in the present row, the first gate electrode 11, which is connected with the gate line 3, is at a high potential such that the first gate electrode 11 is electrically connected to the metal electrode layer 15 through the first amorphous silicon layer 13 and the first n$^+$ amorphous silicon layer 14. Thus, the first gate electrode 11 connected with the gate line 3 applies a high potential through the metal electrode layer 15 to the pixel electrode 5 in the next row, thereby eliminating signal for a last frame remaining on the pixel electrode 5, preventing generation of the DC bias voltage between pixel electrodes due to charge accumulation during a long time display of a same image and effectively reducing the image-sticking phenomenon. As compared with the conventional technology, the image quality is improved while ensuring the aperture ratio of a pixel region.

An exemplary method for manufacturing an array substrate according to the embodiment of the invention is described as follows.

A metal thin film is deposited on a substrate 10 to a thickness of about 1000 Å to about 7000 Å by a magneto-sputtering process. The metal film may be formed of one selected from the group consisting of Mo, Al, Al—Ni alloy, Mo—W alloy, Cr, Cu, and combinations thereof. The metal film may also be a multilayer structure formed of above materials. A plurality of gate lines 3 and a first gate electrode 11 and a second gate electrode 21 that are connected with each gate line 3 are formed on portions of the substrate 10 using a mask for the gate electrodes and gate line by lithography and chemical etching processes, for example.

A gate insulating film having a thickness of about 1000 Å to about 7000 Å is deposited on the substrate 10 formed with the gate lines 3 and its the first gate electrode 11 and the second gate electrode 21. The deposition of the gate insulating film may be performed by a chemical vapor deposition (CVD) process. Then, a via hole 17 may be formed in a portion of the gate insulating film over the first gate electrode 11 by lithography and dry-etching processes, for example.

An amorphous silicon film having a thickness of about 1000 Å to about 6000 Å and an $n^+$ amorphous silicon film having a thickness of about 1000 Å to about 6000 Å may be formed on the substrate 10 with the gate insulating film 12 formed thereon by a CVD method. Then, with a mask for an active layer by lithography and etching process, a first amorphous silicon layer 13 and a first $n^+$ amorphous silicon layer 14 may be formed over the first gate electrode 11, and the first amorphous silicon layer 13 is connected with the first gate electrode 11 through the via hole 17 in the gate insulating film 12; in addition, a second amorphous silicon layer 22 and a second $n^+$ amorphous silicon layer 23 may be formed over the second gate electrode 21.

Using a process similar to that for the gate electrode, a metal film may be formed on the substrate 10 to a thickness of about 1000 Å to about 7000 Å. The metal film may be formed of one selected from the group consisting of Mo, Al, Al—Ni alloy, Mo—W alloy, Cr, Cu and combinations thereof. The metal film may also be a multilayer structure formed of above materials. Then, a plurality of data lines 6, a source/drain electrode layer 24, and a metal electrode layer 15 may be formed in a predetermined region by using a mask. The source/drain electrode layer 24, which comprises a source electrode 241 and a drain electrode 242, may be positioned over the second gate electrode 21. The metal electrode layer 15 may be positioned over the first gate electrode 11. The source electrode 241 in the source/drain electrode layer 24 may be connected with the data line 6. An etching process may be performed to remove a portion of the second $n^+$ amorphous silicon layer 23 exposed by the source/drain electrode layer 24 such that the second amorphous silicon layer 22 thereunder is exposed, forming a channel region. The data lines and gate lines intersect each other to define a plurality of pixel regions.

Using a process similar to that for forming the gate insulating layer and the active layer, a passivation layer 16 is deposited on entire substrate 10 to a thickness of about 1000 Å to about 6000 Å. The passivation layer 16 may be formed of a material such as silicon nitride. With a mask for the passivation layer by lithography and etching process, a first via hole 18 may be formed in a portion of the passivation layer over the metal electrode layer 15, and a second via hole 25 may be formed in a portion of the passivation layer over the drain electrode 241 of the source/drain electrode layer 24.

Next, a transparent electrode may be formed on the substrate to a thickness of about 100 Å to about 1000 Å by a magneto-sputtering process. The transparent electrode may be formed of a material such as indium tin oxide (ITO), indium zinc oxide (IZO), and tin oxide. By lithography and etching processes, pixel electrodes including a pixel electrode 4 in a present row and a pixel electrode 5 in a next row in the matrix are formed, such that the pixel electrode 4 in the present row is connected with the drain electrode 242 in the source/drain electrode layer 24 through the second via hole 25 in the passivation layer, and the pixel electrode 5 in the next row is connected with the metal electrode layer 15 through the first via hole 18 in the passivation layer. Alternatively, in view of each pixel region in a row, the pixel electrode is connected with the gate line in the present row through the thin film transistor of the pixel region and connected with the gate line in the previous row through the thin film diode of the pixel region.

Figure 5:
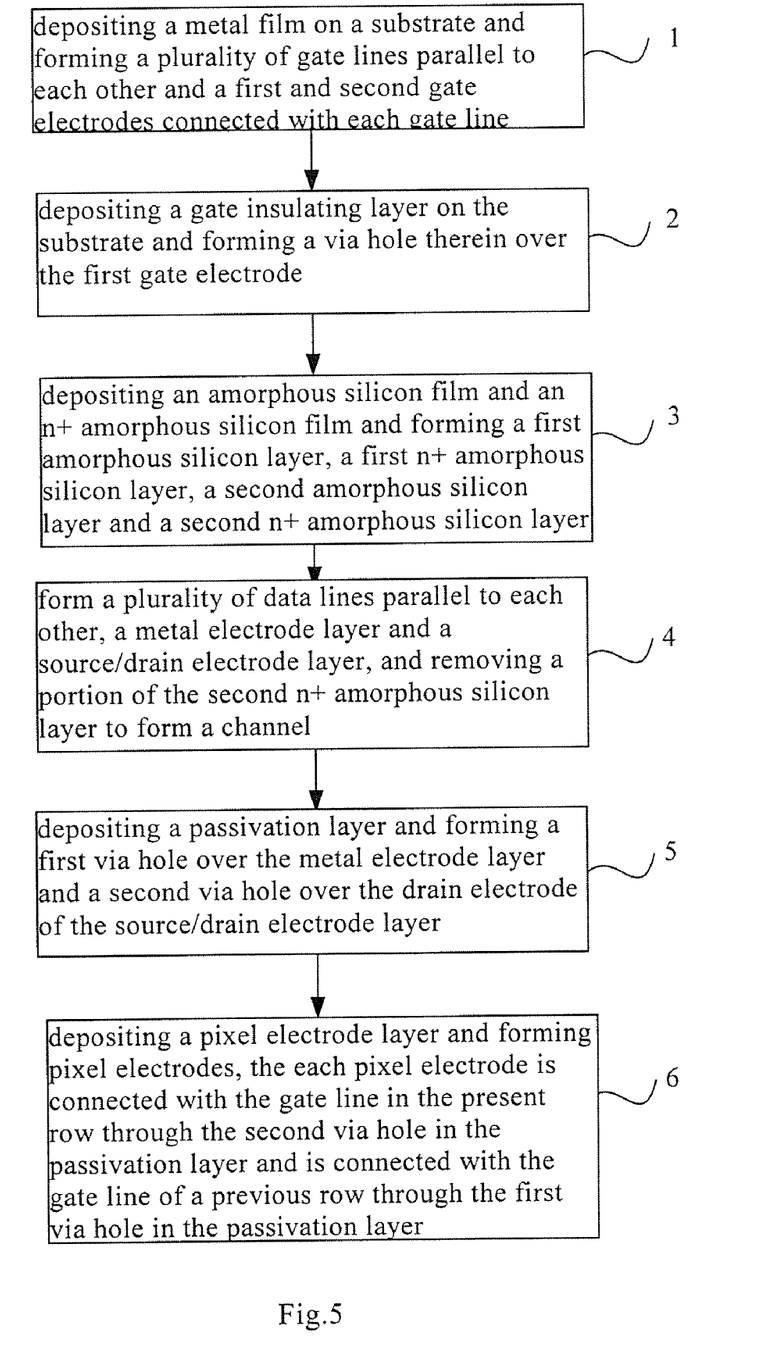
FIG. 5 is a flow chart showing a method of manufacturing the array substrate according to the exemplary embodiment of the present invention.

FIG. 5 is a flow chart showing a exemplary method of manufacturing the array substrate according to the present invention, the method comprising the steps of:

step 1, depositing a metal film on a substrate, and patterning the metal film to form a plurality of gate lines parallel to each other and a first and gate electrode and a second gate electrode connected with each of the gate lines;

step 2, depositing a gate insulating layer on the substrate after step 1, and patterning the gate insulating layer to form a via hole therein over the first gate electrode;

step 3, sequentially depositing an amorphous silicon film and an $n^+$ amorphous silicon film on the substrate after step 2, and patterning the films to form a first amorphous silicon layer and a first $n^+$ amorphous silicon layer over the first gate electrode, such that the first amorphous silicon layer is connected with the first gate electrode through the via hole in the gate insulating layer, and to form a second amorphous silicon layer and a second $n^+$ amorphous silicon layer over the second gate electrode;

step 4, depositing a metal film on the substrate after step 3, and patterning the metal film to form a plurality of data lines parallel to each other, a metal electrode layer and a source/drain electrode layer, wherein a source electrode in the source/drain electrode layer is connected with the data lines, the metal electrode layer is positioned over the first gate electrode, the source/drain electrode layer, which comprises the source electrode and a drain electrode, is positioned over the second gate electrode, and removing a portion of the second $n^+$ amorphous silicon layer exposed by the source/drain electrode layer to form a channel region, and the plurality of gate lines intersecting the plurality of data lines to define a plurality of pixel regions arranged in a matrix;

step 5, depositing a passivation layer on the substrate after step 4, and patterning the passivation layer to form therein a first via hole over the metal electrode layer and a second via hole over the drain electrode of the source/drain electrode layer; and step 6, depositing a pixel electrode layer on the substrate resulting form step 5, and patterning the pixel electrode layer to form pixel electrodes, wherein with respect to each pixel region in a row, the pixel electrode is connected with the drain electrode of the source/drain electrode layer through the second via hole in the passivation layer so as to be connected with the gate line in the present row, and is connected with the metal electrode layer through the first via hole in the passivation so as to be connected with the gate line in a previous row.

Specifically, in step 1, a metal film may be deposited on a substrate to a thickness of about 1000 Å to about 7000 Å by a magneto-sputtering process. The metal film may be formed of one selected from the group consisting of Mo, Al, Al—Ni alloy, Mo—W alloy, Cr, Cu, and combinations thereof. The metal film may also be a multilayer structure formed of foregoing materials. A plurality of gate lines and a first gate electrode and a second gate electrode connected with each of the gate lines may be formed on portions of the substrate using a mask for gate electrodes and gate lines by lithography and chemical etching processes.

In step 2, a gate insulating film is deposited on the substrate formed thereon with the gate lines, the first gate electrode, and the second gate electrode to a thickness of about 1000 Å to about 6000 Å. Next, a via hole may be formed in a portion of the gate insulating film over the first gate electrode by lithography and dry-etching processes.

In step 3, an amorphous silicon film having a thickness of about 1000 Å to about 6000 Å and an $n^+$ amorphous silicon film having a thickness of about 1000 Å to about 6000 Å may be sequentially formed on the substrate formed thereon with the gate insulating film by a CVD method. Then, with a mask for an active layer by lithography and etching processes, a first amorphous silicon layer and a first $n^+$ amorphous silicon layer may be formed over the first gate electrode, such that the first amorphous silicon layer is connected with the first gate electrode through the via hole in the gate insulating film, and a second amorphous silicon layer and a second $n^+$ amorphous silicon layer may be formed over the second gate electrode.

In step 4, using a process similar to that for the gate electrode, a metal film may be formed on the substrate to a thickness of about 1000 Å to about 7000 Å. The metal film may be formed of one selected from the group consisting of Mo, Al, Al—Ni alloy, Mo—W alloy, Cr, Cu, and combinations thereof. The metal film may also be a multilayer structure formed of above materials. Then, a plurality of data lines, a source/drain electrode layer and a metal electrode layer may be formed in a predetermined region by using a mask. The source/drain electrode layer, which comprises a source electrode and a drain electrode, may be positioned over the second gate electrode. The metal electrode layer may be positioned over the first gate electrode. The source electrode in the source/drain electrode layer may be connected with the data line. An etching process may be performed to remove a portion of the second $n^+$ amorphous silicon layer exposed by the source/drain electrode layer such that the second amorphous silicon layer is exposed, forming a channel region.

Using a process similar to that for forming the gate insulating layer and the active layer, a passivation layer is deposited on entire surface of the substrate to a thickness of about 1000 Å to about 6000 Å. The passivation layer 16 may be formed of a material such as silicon nitride. With a mask for the passivation layer by lithography and etching processes, a first via hole may be formed in a portion of the passivation layer over the metal electrode layer, and a second via hole may be formed in a portion of the passivation layer over the drain electrode of the source/drain electrode layer.

In step 6, a transparent electrode may be formed on the substrate to a thickness of about 100 Å to about 1000 Å by a magneto-sputtering process. The transparent electrode may be formed of a material such as indium tin oxide (ITO). By masking, exposure and chemical etching processes, pixel electrodes including a pixel electrode in a present row and a pixel electrode in a next row are formed, such that the pixel electrode in the present row is connected with the drain electrode in the source/drain electrode layer through the second via hole in the passivation layer, and the pixel electrode in the next row is connected with the metal electrode layer through the first via hole in the passivation layer.

In the method of manufacturing an array substrate according to the embodiment of the invention, the gate line is connected to the pixel electrode in the next row through the thin film diode. The thin film diode comprises the first gate electrode, the first amorphous silicon layer, the first $n^+$ amorphous silicon layer and the metal electrode layer. By the thin film diode's characteristic of conduction in a forward direction and cutting off in a reverse direction, when a scan signal is applied, the first gate electrode, which is connected with the gate line in a present row, is at a high potential also such that the first gate electrode is electrically connected to the metal electrode layer through the first amorphous silicon layer and the first $n^+$ amorphous silicon layer. That is, the first gate electrode connected with the gate line in the present row applies a high potential through the metal electrode layer to the pixel electrode in the next row, thereby eliminating signal for a last frame remaining on the pixel electrode, preventing generation of the DC bias voltage between pixel electrodes due to charge accumulation during a long time display of a same image, and effectively reducing the image-sticking phenomenon. As compared with the conventional technology, the image quality is improved while ensuring the aperture ratio. Further, the TFT-LCD pixel structure according to the invention may be implemented under current processing conditions.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. An array substrate of a thin film transistor liquid crystal display comprising:
   a substrate; and
   a plurality of gate lines parallel to each other and a plurality of data lines parallel to each other formed on the substrate, the plurality of gate lines intersecting the plurality of data lines to define a plurality of pixel regions that are arranged in rows, each pixel region comprising a thin film transistor, a pixel electrode, and a thin film diode,
   wherein with respect to each pixel region in a row, the pixel electrode is connected with the gate line used for the pixel regions in a present row through the thin film transistor and directly connected with the gate line used for the pixel regions in a previous row through the thin film diode.

2. The array substrate according to claim 1, wherein the thin film diode of each pixel region comprises:
   a first gate electrode formed on the substrate and connected with the gate line in the present row;
   a gate insulating layer formed on the first gate electrode, covering the entire substrate, and formed with a via hole over the first gate electrode;
   a first amorphous silicon layer formed on the gate insulating layer and connected with the first gate electrode through the via hole in the gate insulating layer;
   a first $n^{30}$ amorphous silicon layer formed on the first amorphous silicon layer;
   a metal electrode layer formed on the first $n^{30}$ amorphous silicon layer and positioned over the first gate electrode;
   a passivation layer formed on the metal electrode layer, covering the entire substrate, and formed with a first via hole through which the pixel electrode is connected with the metal electrode layer.

3. The array substrate according to claim 2, wherein the thin film transistor of each pixel region comprises:
   a second gate electrode form on a substrate and connected with the gate line of the previous row;
   the gate insulating layer formed on the second gate electrode and covering the entire substrate;
   a second amorphous silicon layer formed on the gate insulating layer and positioned over the second gate electrode;
   a second $n^{30}$ amorphous silicon layer formed on the second amorphous silicon layer;

a source/drain electrode layer formed on the second $n^{30}$ amorphous silicon layer and positioned over the second gate electrode with a channel region being formed between source and drain electrodes of the source/drain electrode layer;

the passivation layer formed on the source/drain electrode layer, covering the entire substrate, and formed with a second via hole through which pixel electrode is connected with the drain electrode of the source/drain electrode layer.

4. The array substrate according to claim 2, wherein the first gate electrode is formed of a material selected from Mo, Al, Al-Ni alloy, Mo—W alloy, Cr, Cu, and any combination thereof.

5. The array substrate according to claim 2, wherein the metal electrode layer is formed of a material selected from Mo, Al, Al—Ni alloy, Mo—W alloy, Cr, Cu, and any combination thereof.

6. The array substrate according to claim 3, wherein the passivation layer is formed of silicon nitride.

7. The array substrate according to claim 3, wherein the pixel electrode is formed of indium tin oxide.

8. The array substrate according to claim 1, wherein each pixel region consists of a single thin film diode which directly connects the pixel electrode to the gate line used for the pixel regions in the previous row.

* * * * *

UNITED STATES PATENT AND TRADEMARK OFFICE
CERTIFICATE OF CORRECTION

PATENT NO. : 7,910,925 B2
APPLICATION NO. : 12/128745
DATED : March 22, 2011
INVENTOR(S) : Zhilong Peng It is certified that error appears in the above-identified patent and that said Letters Patent is hereby corrected as shown below:

The expression "$\underline{n}^+$" in Claim 2, lines 49 and 51, Column 8, and in Claim 3, line 66, Column 8, and line 1, column 9, was wrongly entered as "$\underline{n}^{30}$".

Signed and Sealed this
Thirty-first Day of May, 2011

David J. Kappos
*Director of the United States Patent and Trademark Office*